March 24, 1959 J. J. ZIMMERMAN 2,878,475

ELECTRICAL COMPONENT PLACING DEVICE

Filed June 16, 1958 3 Sheets-Sheet 1

Inventor:
Jack J. Zimmerman
By Pennie Edmonds Morton Barrows & Taylor
Attys.

March 24, 1959 J. J. ZIMMERMAN 2,878,475

ELECTRICAL COMPONENT PLACING DEVICE

Filed June 16, 1958 3 Sheets-Sheet 2

Inventor:
Jack J. Zimmerman
By [signature] Attys.

Inventor:
Jack J. Zimmerman
By Parris Edwards Newton Burns & Taylor
Attys.

United States Patent Office 2,878,475

Patented Mar. 24, 1959

2,878,475

ELECTRICAL COMPONENT PLACING DEVICE

Jack J. Zimmerman, Riverside, Ill., assignor to Die-Form Circuits of Delaware, Inc.

Application June 16, 1958, Serial No. 742,074

18 Claims. (Cl. 1—82)

This invention relates to improvements in the method and apparatus for mounting electrical or electronic circuit components upon a chassis or panel, and particularly to the mounting or positioning of such components in desired circuit relationship to other components of the circuit in an automatic fashion.

In many electrical circuits, particularly electronic circuits, components such as fixed resistors, capacitors and the like are used in profusion. In assembling such circuits the inclusion of such components in the circuit has until comparatively recently been a manual operation which has been slow and costly. Recently, the desirability of automatic assembly of such circuits has been recognized particularly with the advent of smaller components, more numerous components, and of so-called printed circuits. This endeavor to automatically assemble such circuits is now included in the suggestive expression, "automation."

In view of the fact that in most electronic circuits such components as resistors, capacitors and the like are most numerous and are usually the smallest and most troublesome to handle, the problem of automatic assembly hinges primarily in the effective handling of such parts. Devices have heretofore been proposed for automatically handling such parts, but in substantially all cases the devices have been so intricate, critical and expensive that the advantages of their use have substantially been lost due to the ineffectiveness of the devices themselves.

The present invention relates to a simple, effective mechanism for automatically handling and placing such components as fixed resistors, capacitors and the like in their proper relationship to other components of a network by which the full advantage may be taken of the promised savings and efficiency connoted in "automation."

For purposes of simplicity and clearness of description, although the mechanism contemplated in the present invention may be used in multiple units or batteries, but one unit is shown and described, it being understood that multiple units, that is, duplication of the described basic unit described, may be, and in most instances will be, employed.

The objects and advantages of the present invention will be more fully apparent from the accompanying drawings and following detailed description.

In the device comprising the present invention, two movable elements are generally contemplated, as will be hereinafter more fully described. The elements, during one phase of the operation move together and at another phase move relative to each other. The present invention is not concerned with the specific mechanical or kinematic movements, as such, as they may be brought about by numerous means employing conventional levers, cams, gears or the like. The present invention, however, is particularly concerned with the mechanism which is actuated as a result of the basic conventional movements, particularly when the two movable elements move relative to each other.

The unit device contemplated herein comprises generally two moving parts, a guide tube 1 and a plunger 2 which latter at predetermined phases of operation moves within the guide tube 1. The central front portion of the guide tube is cut away for the full length thereof so that the front of the guide tube consists merely of the walls 34 and 34', which are spaced a distance from one another slightly greater than the length of the body of the electrical component to be assembled onto a circuit panel.

Figures 3, 4, 5, 6:
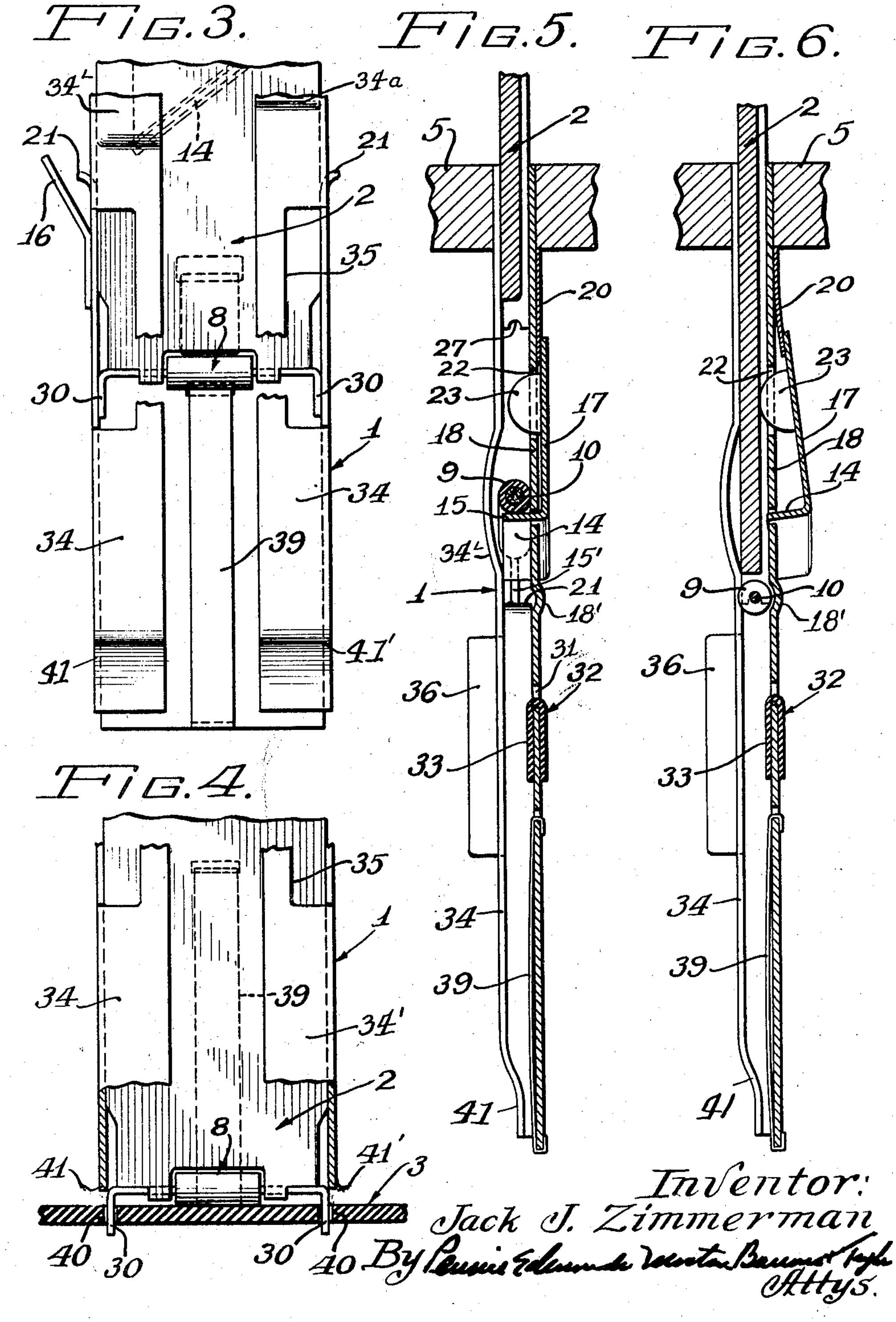
Fig. 3 is a view similar to Fig. 2 showing the component rolled to its intended vertical position.
Fig. 4 is a similar view illustrating the rolled component as placed upon a portion of the chassis, plate, or panel.
Fig. 5 is a sectional view taken on line 5—5 of Fig. 1.
Fig. 6 is a similar view showing parts in a sequential position.
Figures 7, 8, 9, 10, 11:
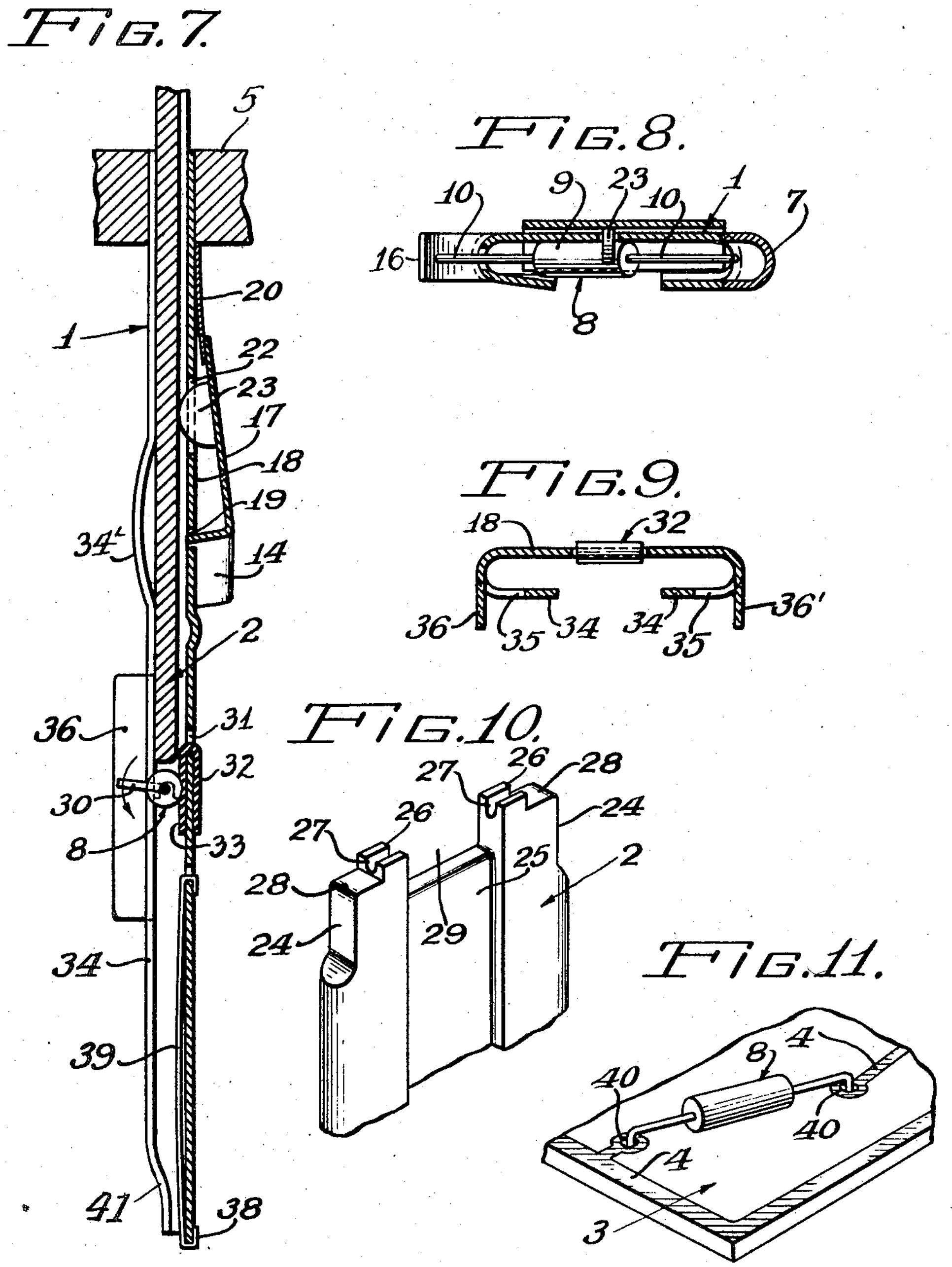
Fig. 7 is a similar view illustrating the position of the parts at a phase subsequent to that shown in Fig. 6.
Fig. 8 is a detailed sectional view taken on line 8—8 of Fig. 1.
Fig. 9 is a detailed sectional view taken on line 9—9 of Fig. 1.
Fig. 10 is a detailed perspective view showing the operative end portion of the plunger employed in the device.
Fig. 11 is a fragmentary perspective view of a component positioned upon a chassis, plate or panel and included in an electrical circuit or network.

The reference numeral 3, Figs. 4 and 11, indicates a chassis, plate, or panel upon which the circuit components may be carried, and for purposes of illustration, the plate 3 is shown as being of the printed circuit type wherein network conductors 4 may be "printed" or otherwise formed upon the plate. Of course, the present invention is not to be limited to this type of circuitry since the advantages of the invention are obtainable with other forms of networks.

The guide tube 1 is preferably constructed of relatively thin metal, plastic or the like and is relatively elongated and of relatively flat rectangular cross-section. The guide 1 is rigidly carried by a reciprocable member 5 which is secured to suitable mechanism (not shown) for moving the guide tube, particularly the lower end thereof, toward and away from the face of the plate 4.

The plunger 2 is constructed of relatively flat stock, preferably metal, and is secured at its upper end portion to a reciprocable member 6. The members 5 and 6 move in timed relationship to each other wherein during predetermined phases of operation the guide tube 1 and plunger 2 move together and at other phases the plunger moves telescopically within the guide.

A feed conduit 7 connects into an intermediate portion of tube 1 and is carried thereby and moves therewith. The conduit 7 functions to convey components 8 from a suitable source of supply (not shown) to the interior of the guide tube 1. The components 8 employed with the present invention are of the type having a substantially cylindrical body 9 and two axially outwardly-extending connectors 10. The components 8 move axially through conduit 7 and the major length of said conduit is disposed substantially parallel and laterally adjacent the guide 1. By this disposition of the feed conduit lateral space is saved and a plurality of units may be placed laterally adjacent each other if a battery of such units is used whereby a plurality of components may be simultaneously placed upon a plate closely adjacent one another.

Since the distance between the rear wall of the guide tube and the front walls 34 and 34′ is less than the diameter of the body 9 of the components 8, the front wall 34′ is bulged outwardly as at $34^a$ to provide ample space to permit the components to pass from the feed conduit 7 into the guide tube. The front wall 34 is provided with a similar outward bulge $34^b$ to allow additional space for the passage of the leading connector of the component as the components are fed into the guide tube, as hereinafter described.

The conduit 7 for a portion of its length is straight, but adjacent its lower portion is curved whereby the components may be delivered from the conduit 7 transversely to the axis of the guide tube 1 through an elongated opening in the edge thereof. In view of the fact that the components 8 are straight and of appreciable length relative to the length of the arc 11, the lower portion of the conduit 7 is cut away, as shown best at 12 in Fig. 1, for the full length of the opening in the edge of the guide tube, so that the components may make the turn, that is, by cutting away or enlarging the conduit at its arcuate portion the components may assume a chordal position, as shown by the component 13, shown in broken lines in Fig. 1. Any known means may be provided for feeding the components one at a time from the conduit 7 into the guide tube in timed relation to the operation of the plunger 2.

At the lower end of the conduit 7, the component is discharged in a diagonal fashion into the interior of the guide tube 1. A ledge or temporary supporting flange 14 is carried in the guide tube and is disposed in an inclined angle therein which conforms substantially to the axial path of travel of the component from the feed conduit. The edge wall of the guide, opposite conduit 7, is cut away, as shown best at 15 in Figs. 1 and 5, through which the connector 10 of a component 8 delivered to ledge 14 may protrude. A stop 16 is carried upon guide 1 adjacent opening 15 which functions as an abutment to properly position the delivered component upon ledge 14.

The ledge 14 comprises a diagonally-disposed flange which is preferably formed integral with a ledge plate 17, the rear wall 18 of the guide tube 1 being provided with a slot 19 through which the flange or ledge 14 protrudes. The ledge plate 17 at its upper end is carried by a blade or leaf spring 20 which, in turn, is secured to the outer face of the guide wall 18. The arrangement is such that the spring 20 normally urges the plate 17 to plane-parallel position with the rear wall 18 of the guide and, hence, causes the ledge or flange 14 to protrude into the guide and assume a supporting position with respect to component 8 delivered from conduit 7.

During one phase of operation of the device the ledge 14 is withdrawn from supporting position with respect to the carried component and, hence, the component drops within the guide 1. Beneath the ledge 14, a portion of the walls of guide tube 1 is struck outwardly, as shown best in Figs. 1 and 2, to form opposite bending members 21. When the ledge 14 drops the carried component, the component falls until the opposite connectors 10 of the component 8 rest upon the bending members 21, as shown best in broken lines at 8′ in Fig. 1.

As best shown in Fig. 5, the edge wall of the guide tube having the cut-away opening 15 has a slot 15′ extending downwardly from the opening 15 so that when the lower connector 10 protrudes through the opening 15 it will drop into the slot 15′. The slot 15′ is only slightly wider than the diameter of the connector. Thus, it will be steady and guide the component 8 and its extending connectors into proper position within the guide tube when the ledge 14 is withdrawn to permit the component to drop with its connectors resting upon the bending members 21. Since the component drops only a small distance and since the stop 16 exerts a frictional resistance on the end of the lower connector, it has been found that there is no tendency for the component to move endwise and it always will drop into proper position, centrally disposed within the guide tube. The rear wall 18 of the guide tube is bulged outwardly opposite the position of the body of the component 8′, as at 18′, Figs. 5 and 6, to further assure that the component is properly positioned in the guide tube when it drops onto the bending members 21.

During the operation hereinbefore described, the plunger 2 moves downwardly with respect to the guide tube to a position immediately above ledge 14. When a component has been delivered to the position occupied by the component 8′, the plunger, by means of movable member 6, continues to move downwardly within tube 1. Above ledge 14, the rear wall 18 of the guide tube is provided with a slot 22 through which a cam lobe 23 carried by plate 17 extends. When ledge 14 is in extended supporting position, the cam lobe 23 protrudes into the guide tube 1 and is disposed in the path of travel of the plunger 2 when the member 6 moves the plunger downwardly within the guide tube. Thus, the plunger 2 in its initial movement contacts the cam lobe 23 and moves the plate 17 outwardly and the ledge or flange 14 moves from its supporting position with respect to the carried component. In this fashion the component is released to the supported position 8′ upon the bending members 21.

Referring particularly to Fig. 10, the operative end portion of plunger 2 is illustrated. Throughout the major portion of the length of the plunger 2, the plunger is of a width slightly smaller than the interior width of the guide tube 1 so that said plunger may freely move within the guide without excessive lateral play. However, adjacent the end of the plunger, the plunger is relieved, as at 24 in Fig. 10, whereby said end portion is of relatively restricted width. Also, adjacent the end portion of the plunger the plunger is of restricted thickness, as indicated at 25 in Fig. 10. The purposes of these width and thickness restrictions will be hereinafter more fully described.

In addition, the end portion of the plunger carries a pair of spaced slotted projections 26, the slots 27 being adapted to function as bearings for the connectors 10, as will be hereinafter more fully described. A pair of shoulders 28 extend outwardly from each projection, said shoulders being substantially flush with the bases of the bearings or slots 27. Inwardly of the projections 26, the plunger is relieved to provide a space 29 provided to receive the body 9 of a component 8.

The construction of the plunger end is such that a component 8 may be received therein with the connectors 10 disposed in the slots or bearings 27 and in contact with the shoulders 28 and the body 9 of the component freely rotatable about the connector axes in the space 29.

Figures 1, 2:
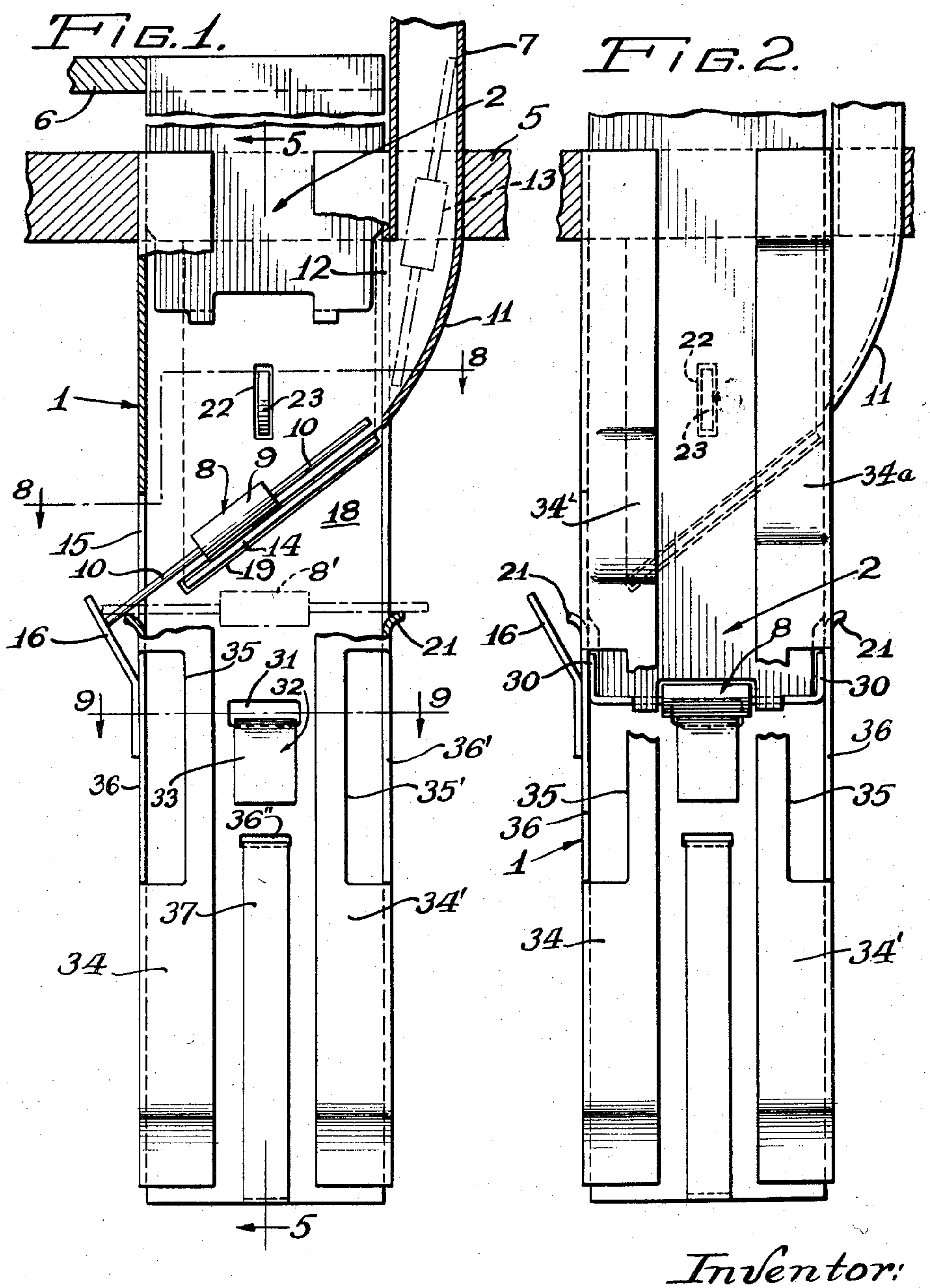
Fig. 1 is a front elevational view, parts being broken away and parts being shown in section, of my improved component placement device.
Fig. 2 is a similar view of the device with a different portion broken away to show the component rotating mechanism.

With the component 8 in the position 8′, as illustrated in Fig. 1, the plunger 2 continues its descent within the tube 1. Eventually, the operative end portion of the plunger moves against the extending connectors 10, which are received into the slots or bearings 27 of the end of the plunger. In this position the plunger end engages only the connectors 10 and the body 9 of the component is positioned in the space 29 out of contact with the plunger per se. As the downward movement of the plunger proceeds, the component 8 is carried downwardly therewith and a bending stress is exerted upon the end portions of the connectors 10 by the bending members 21. By the provision of the bearings 27 and shoulders 28, and by the restricted width of the plunger due to the relieved portions 24, the bending stress exerted upon the connectors 10 is concentrated and confined at a predetermined portion of the length of each of the connectors. As the downward movement of the plunger continues the outer ends of the connectors are bent at substantially right angles until they lie within the relieved portions 24 of the plunger. These relieved portions are of sufficient dimensions to receive the entire bent portions 30 of the connectors. The bent portions 30 of the connectors now occupy a position, best shown in Fig. 2, in which they are confined between the inner walls of the guide and the relieved portions of the plunger and in a position in which they trail the body 9 of the component.

Beneath the bending members 21, the rear wall 18 of the guide is provided with a transverse aperture 31. A friction pad member 32 is threaded through the aperture 31 in substantially U-shaped fashion, with one face 33 of the pad member being disposed in plane-parallel relationship with the inner surface of the wall 18. The pad member 32 may be constructed of rubber or other resilient material having high surface frictional characteristics and may be secured in place adhesively or in any other desired manner. Inasmuch as the face 33 of the pad member is the only operative portion of the pad member, a flat pad member may, if desired, be merely adhesively united to the inner face of the wall 18 instead of the arrangement shown wherein the pad member is threaded through the aperture 31. However, in view of the fact that the upper edge portion of the pad member is brought into frictional contact with the body 9 of the component, as will be hereinafter more fully described, it has been found that the arrangement illustrated is more rugged and the possibility of stripping the pad from its position is minimized.

As the plunger 2 continues its downward travel relative to the tube 1, the body 9 of the component 8 eventually contacts the upper edge of the friction pad 33. In this fashion, while the plunger is moving downwardly a torque is exerted upon the body 9 by its frictional contact with the frictional pad 33 and the entire component tends to rotate. The front walls 34 and 34′ of the guide tube 1 is provided with relatively elongated apertures 35 and 35′ adjacent opposite sides of the guide tube. The apertures 35 and 35′ preferably are formed by striking up the cut away portions of the stock comprising the front faces 34 and 34′ to form outwardly-extending ears 36 and 36′.

Hence, as the plunger descends and the component 8 rotates, the end portions 30 of the connectors swing outwardly through the apertures 35 and 35′. In this fashion the component is permitted to rotate through an angle of substantially 180° until the bent portions 30 of the connectors again contact the rear wall 18 of the guide tube 1. In this fashion during the descent of the plunger the component is so oriented that the bent end portions 30 of the connectors carried by the component are moved from an upwardly-extending position in which they trail the body of the component to a downwardly-extending position in which they lead the body of the component. As will be hereinafter more fully described, this is the position that the components are eventually delivered to the plate 3.

The rear wall 18 of the guide tube 1 beneath the pad 32 is provided with a slot 36″ in which one end portion of a bulged blade spring 37 in anchored. The opposite end portion of said spring is anchored at the bottom or delivery end of the guide tube, as shown best at 38 in Fig. 7. The spring 37 is so held in its mounting that the central portion thereof bulges outwardly as indicated at 39 in Fig. 7 and is positioned in the path of travel of the body 9 of the component 8.

The arrangement is such that as the component 8 passes downwardly through the guide tube from the position shown in dot-and-dash lines in Fig. 1 to the discharge end of the guide tube, the body 9 of the component will pass between the inner edges of the front faces 34 and 34′, since its length is slightly less than the distance between those edges, while the extending connectors will be confined in the spaces between the respective front faces 34 and 34′ of the guide tube and the rear wall thereof, except when the component is being rotated through 180°, at which time the bent ends of the connectors will swing through the openings 35 and 35′.

As the plunger 2 continues its descent and after the component has been rotated through an angle of 180°, the body 9 of the component leaves the frictional member 33 and would normally drop freely through the lower end portion of the guide tube. However, the body 9 of the component substantially immediately contacts the blade spring 39 and said spring exerts a frictional resistance upon said body. Hence, the component does not fall freely but must be moved downwardly by the positive acting force of the plunger.

The lower end of the guide tube is open and hence as the plunger continues its downward passage, the component is eventually delivered at the lower end of the guide tube.

By suitable mechanism (not shown) the guide tube 1 carrying the plunger may be moved to a desired position with respect to the plate 3. The plate 3 is normally provided with receiving apertures 40 which are so spaced as to conform with the bent end portions 30 of the connectors 10. Hence, when the connector is delivered at the end of the guide tube the bent ends 30 of the connectors are threaded into the appropriate receiving apertures 40, as shown best in Fig. 4. In this fashion the component is automatically delivered to a predetermined location upon a plate or panel 3 and is disposed in operative relationship to the circuitry carried by the plate or panel.

To assure that the bent ends of the connectors will be in proper alignment with the openings 40 of the plate 3 when they are discharged from the lower end of the guide tube, the bottom portions 41 and 41′ of the front plates 34 and 34′ are pinched in or bent back towards the rear wall of the guide tube to provide a discharge space for the bent ends of the connectors not substantially wider than the diameter of the connectors.

After the components have been discharged from the lower end of the guide tube and the bent ends of the connectors threaded into the openings 40 of the plate 3, the guide tube and plunger move upwardly away from the deposited component. In order to prevent lifting of the component from its deposited position by the frictional engagement of the walls of the guide tube with the bent end portions 30, said walls are cut away as shown best at 41 in Fig. 4. Hence, the end portions 30 of the connectors 10 when deposited in the apertures 40 are relieved of their contact with the walls of the guide tube. Accordingly, the guide tube and plunger may then be moved upwardly away from the component without displacing the component from its deposited position.

It is to be understood that various changes may be made in the details of construction of the apparatus or in the method of assembling the components onto the circuit panel, within the scope of the appended claims, without departing from the spirit of the invention or sacrificing any of the advantages thereof.

This application is a continuation-in-part of my copending application Serial No. 583,203, filed May 7, 1956, now abandoned.

I claim:

1. The method of assembling an electrical component having a body and connectors extending from its opposite ends onto a panel carrying an electrical circuit and having openings to receive said extending connectors which comprises moving the component along a rectilinear path with the connectors extending transversely to the direction of movement of the component, bending the extending connectors during movement of the component along said path to a position in which their bent ends trail the body of the component, rotating the component about its axis, after the extending connectors have been bent and while the component still is moving along said rectilinear path, to a position in which the bent ends of the connectors are leading the body of the component, relatively positioning the component with respect to such panel that the leading bent ends of the connectors are aligned with the openings in the panel, and then relatively moving the component with respect to the panel, while maintained in such position, until the bent ends are inserted into said openings.

2. The method of claim 1 in which the component is rotated through an angle of approximately 180°.

3. The method of claim 1 in which the rotation of the component is caused by moving it over an element having high surface frictional characteristics.

4. A device for assembling an electrical component including a body and oppositely-extending conectors in an electrical circuit formed on a panel member which comprises a guide having a discharge end for guiding a component to a predetermined position in a circuit plate, means for feeding such component to said guide, a plunger mounted for movement along said guide to engage and move a component fed to the guide rectilinearly therealong, means positioned intermediate the path of movement of said extending connectors as said component is moved along the guide by the plunger for obstructing the movement of said connectors and for causing the end portions of said connectors to be bent in a direction trailing the body of the component as the plunger forces the component past said obstructing means, means for rotating said component about its axis, after the extending connectors have been bent and while said component is moving rectilinearly along said guide to dispose said bent ends of the connectors in the direction leading the body of the component, whereby when said component is discharged from the discharge end of the guide the bent end portions of the connectors will extend forwardly of the body.

5. A device as set forth in claim 4 in which the end of the plunger which moves the component along the guide is centrally recessed to receive the body of the component and the end portions of the plunger at each side of the recess engage the extending connectors and apply to them the force necessary to move the components along the guide.

6. A device as set forth in claim 5 in which the sides of the plunger adjacent said end are relieved to provide spaces to receive the bent ends of the connectors.

7. A device as set forth in claim 5 in which the end portions of the plunger which engage the extending connectors have slots to receive the extending connectors.

8. A device as set forth in claim 4 in which the discharge end of the guide has means for accurately positioning the bent ends of the connectors to facilitate their insertion into openings in the panel member.

9. A device for automatically positioning an electrical component comprising a body and oppositely extending connectors in an electrical circuit which comprises, a guide having a discharge end for guiding a component to a predetermined position in a circuit plate, means for feeding a component to said guide, a plunger movably positioned in said guide to move said fed component along the guide, means carried by said guide for obstructing the movement of the end portions of said connectors when said plunger moves said component along the guide, whereby said end portions are bent in a direction trailing the body of the component, means carried by said guide for frictionally contacting the side of the body of said component as it is moved by said plunger to rotate said component about the axis of said connectors and to dispose said bent end portions of the connectors in the direction leading the body of the component, whereby the component is discharged at the discharge end of said guide with the bent end portions of said connectors extending forwardly of the body thereof.

10. A device for automatically positioning an electrical component comprising a substantially cylindrical body and opposite end-extending connectors in an electrical circuit which comprises, a guide tube having a discharge end for guiding a component to a predetermined position in a circuit panel, means for feeding a component to said guide tube and disposing it therein transversely to said guide tube, a plunger movably positioned in said guide tube to move said fed component along the guide tube, means carried by said guide tube for obstructing the passage of the opposite end portions of said connectors, whereby said end portions are bent in a direction trailing the body of the component, means carried by said guide tube for frictionally contacting the side of the body of said component as it is moved by said plunger to roll said component about the axis of said connectors and to dispose said bent end portions of the connectors in the direction leading the body of the component, whereby the component is discharged at the discharge end of said guide tube with the bent end portions of said connectors extending forwardly of the body thereof.

11. A device for automatically positioning an electrical component comprising a substantially cylindrical body and opposite end-extending connectors in an electrical circuit which comprises, a generally vertically-extending guide tube having a discharge end for guiding a component to a predetermined position in a circuit panel, means for feeding a component to said guide tube and disposing it therein transversely to said guide tube, a plunger movably positioned in said guide tube to move said fed component downwardly in the guide tube while the component is disposed transversely to said tube, means carried by said guide tube for obstructing the downward passage of the end portions of said connectors while permitting the downward passage of the body of the component whereby said end portions are bent at substantially right angles in a direction trailing the body of the component, friction means carried by said guide tube for contacting a lateral side of the body of said component as it is moved downwardly by said plunger to rotate said component about the axis of the unbent portions of said connectors and to dispose said bent end portions of the connectors in the direction leading the body of the component, whereby the component is discharged at the discharge end of said guide tube with the bent end portions of said connectors extending forwardly of the body thereof.

12. A device for automatically positioning an electrical component comprising a substantially cylindrical body and opposite end-extending connectors in an electrical circuit which comprises, a guide having a discharge end for guiding a component to a predetermined position in a circuit panel, means for feeding a component to said guide and disposing it transversely relative to said guide, a plunger movable along said guide, engaging members carried by said plunger to rotatably engage the opposite connectors to move said fed component along the guide, means carried by said guide for obstructing the passage of the end portions of said connectors while permitting the passage of the body of the component, whereby said end portions on being pushed past said obstructing means are bent in a direction trailing the body of the component, means carried by said guide for frictionally contacting the side of the body of said component as it is moved by said plunger to rotate said component and the unbent portions of the connectors in said plunger engaging members about the axis of the component and to dispose said bent end portions of the connectors in the direction leading the body of the component, whereby the component is discharged at the discharge end of said guide with the bent end portions of said connectors extending forwardly of the body thereof.

13. A device for automatically positioning an electrical component comprising a body and oppositely extending connectors in an electrical circuit which comprises, a guide tube having a discharge end for guiding a component to a predetermined position in a circuit plate, means for feeding a component to said guide tube and disposing it therein transversely to said guide tube, a plunger movably positioned in said guide tube to move said fed component through the guide tube, means carried by said guide tube for obstructing the passage of the end portions of said connectors whereby said end portions are bent in a direction transverse to said body and trailing the body of the component, resilient friction means carried by said guide tube for frictionally contacting the side of the body of said component as it is moved by said plunger to rotate siad component about the axis of said connectors and to dispose said bent end portions of the connectors in the direction transverse to said component body and leading the body of the component, whereby the component is discharged at the discharge end of said guide tube with the bent end portions of said connectors extending forwardly of the body thereof.

14. A device for automatically positioning an electrical component comprising a body and opposite end-extending connectors in an electrical circuit, said device comprising a guide tube having a discharge end, a movable support carried in said guide tube for holding a component in said tube transversely to said tube, means for feeding a component onto said movable support, a plunger reciprocably movable in said guide tube, means carried by said guide tube beneath said movable support for engaging the opposite connectors of a component adjacent their ends to hold the component at substantially right angles to said guide tube, means connected to said movable support and coacting with said plunger when the latter is moved to withdraw said support thereby dropping said component from said support onto said engaging means, said engaging means comprising bending members for reacting upon said connectors when the component is moved by said plunger to bend the end portions of said connectors in a direction transverse to said component body and trailing said body, friction means carried by said guide tube for frictionally contacting a lateral side of the component body to rotate said body as the plunger moves the component to dispose the bent portions of the connectors transverse to the component body and leading said body whereby said component with bent connectors is discharged at the discharge end of the guide tube by said plunger.

15. A device for feeding an electrical component including a body and oppositely-extending connectors and for bending said connectors which comprises a guide having a discharge end, means for feeding such components to said guide in seriatim, a withdrawable support having a component-supporting portion positionable in said guide to receive and temporarily support a component fed to said guide in a position transversely of the guide, a plunger mounted for movement along the guide, means positioned along the guide beyond said support in the direction of movement of the plunger towards the discharge end of the guide for engaging the extending connectors and obstructing movement of components fed to the guide therealong, means for withdrawing said withdrawable support during movement of the plunger towards the discharge end of the guide and before the leading end of the plunger has engaged the component to permit the component to move from said support towards the discharge end of the guide and the extending connectors to be engaged by said obstructing means, said obstructing means including bending members for reacting upon said connectors when the component is moved past them by the plunger to bend said connectors, whereby said components are discharged from the guide with bent connectors.

16. A device as set forth in claim 15 in which the withdrawable support is resiliently biased to a position in said guide.

17. A device as set forth in claim 15 which includes means connected to said support and coacting with said plunger when said plunger moves forward on a discharging stroke to cause withdrawal of said support.

18. A device as set forth in claim 15 including stop means for indexing components fed onto said support.

No references cited.